United States Patent [19]

Phy

[11] Patent Number: 4,791,473
[45] Date of Patent: Dec. 13, 1988

[54] PLASTIC PACKAGE FOR HIGH FREQUENCY SEMICONDUCTOR DEVICES

[75] Inventor: William S. Phy, Los Altos Hills, Calif.

[73] Assignee: Fairchild Semiconductor Corporation, Cupertino, Calif.

[21] Appl. No.: 943,339

[22] Filed: Dec. 17, 1986

[51] Int. Cl.$^4$ .................................................. H01L 23/48
[52] U.S. Cl. .......................................... 357/70; 357/65
[58] Field of Search ..................................... 357/65, 70

[56] References Cited

U.S. PATENT DOCUMENTS

| | | | |
|---|---|---|---|
| 4,252,864 | 2/1981 | Coldren | 428/571 |
| 4,477,827 | 10/1984 | Walker et al. | 357/70 |
| 4,551,746 | 11/1985 | Gilbert et al. | 357/74 |
| 4,680,613 | 7/1987 | Daniels et al. | 357/70 |

FOREIGN PATENT DOCUMENTS

| | | | |
|---|---|---|---|
| 59-89438 | 5/1984 | Japan | 357/70 |
| 2173342A | 10/1986 | United Kingdom | 357/70 |

OTHER PUBLICATIONS

"The Impact of Inductance on Semiconductor Packaging" by Schaper, L. W., Published: Proc. First Annual Conf. Int'l. Elect. Packaging Soc., Cleveland, Ohio, Nov. 9-10, 1981.

Primary Examiner—Martin H. Edlow
Assistant Examiner—Gregory A. Key
Attorney, Agent, or Firm—Lee Patch; Robert C. Colwell; James M. Heslin

[57] ABSTRACT

A plastic semiconductor package suitable for high frequency operation includes an internal ground plane connected to a ground ring formed on the packaged semiconductor device. The ground plane is included as a portion of a lead frame strip adjacent to the individual lead frames. The ground plane is first folded underneath the paddle support of the lead frame, and the semiconductor die subsequently mounted on the paddle. The ground plane includes a plurality of bumps which protect upward between adjacent lead fingers of the lead frame when the ground frame is folded. A ground frame on the semiconductor die is connected to the bumps, and the signal bonding pads connected to the lead fingers, typically by wire or tape bonding. The package is then encapsulated in plastic by conventional means, and the package trimmed to its final desired configuration.

14 Claims, 2 Drawing Sheets

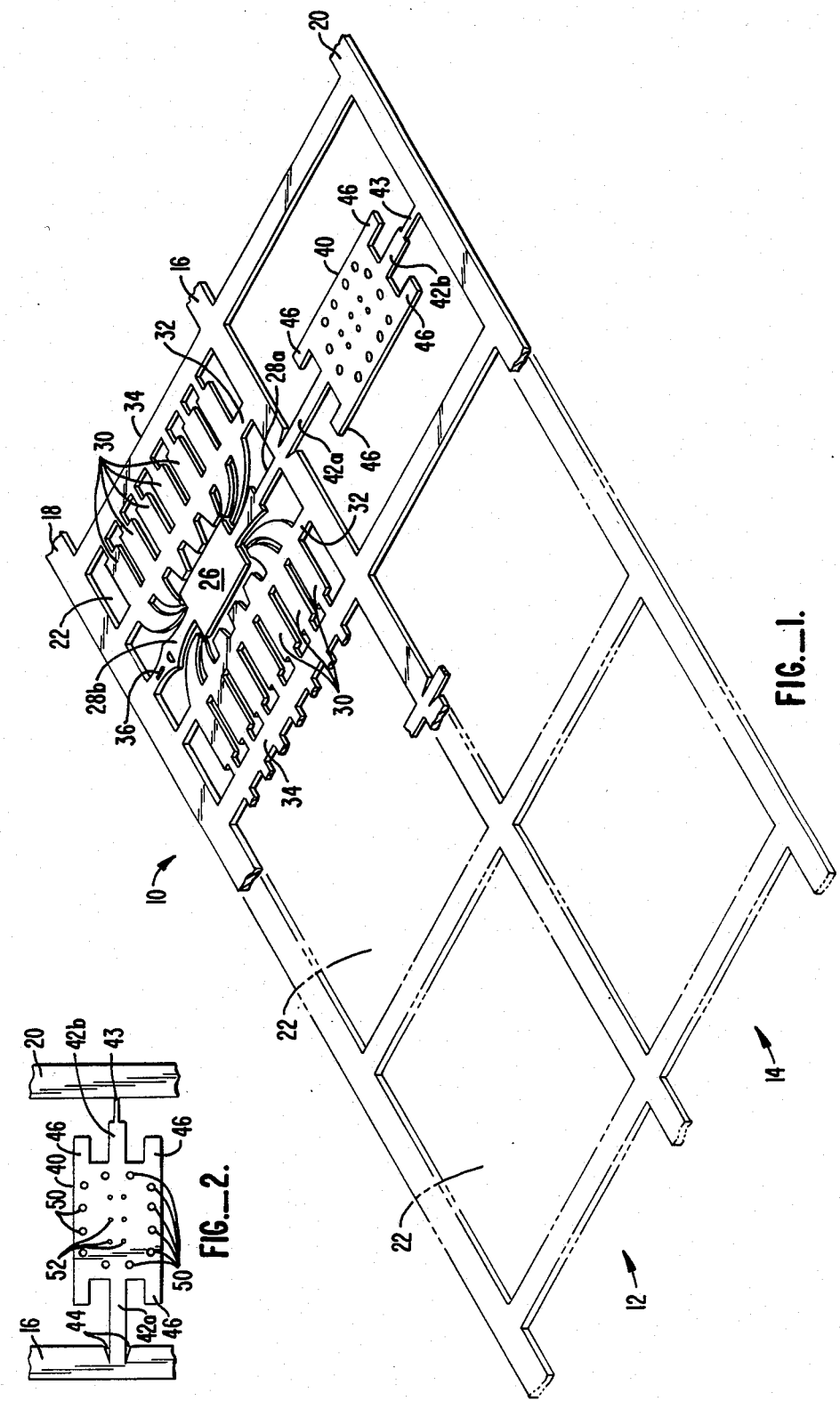

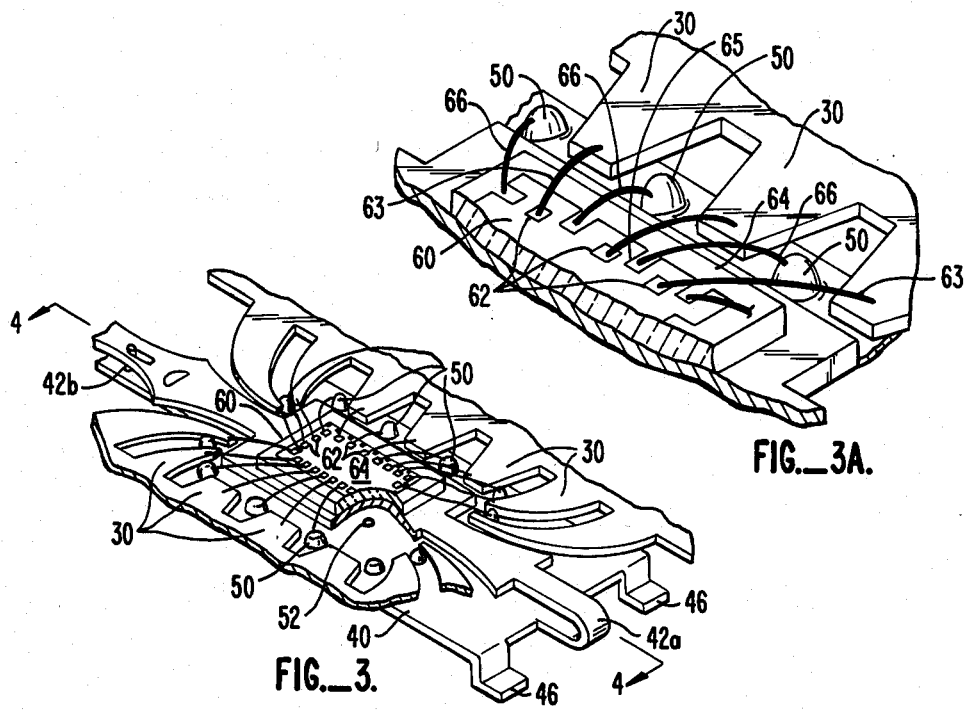
FIG._3A.
FIG._3.
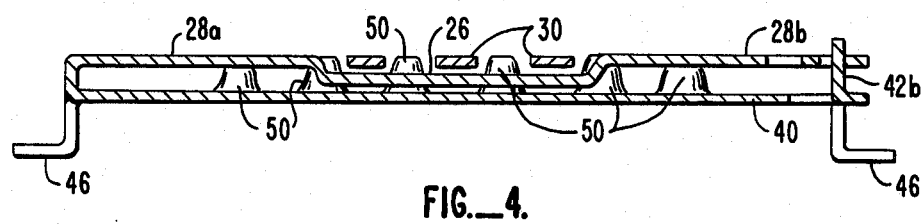
FIG._4.
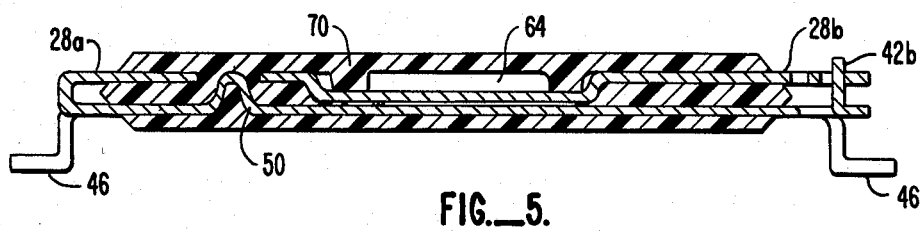
FIG._5.
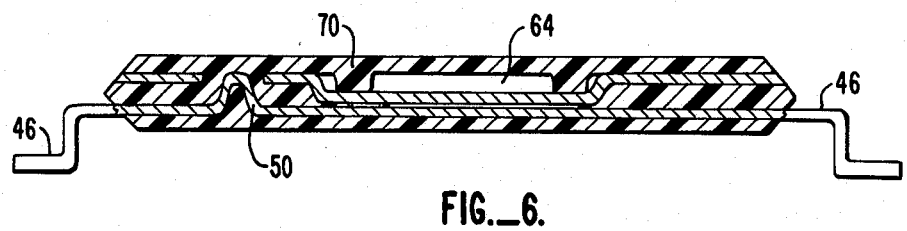
FIG._6.

PLASTIC PACKAGE FOR HIGH FREQUENCY SEMICONDUCTOR DEVICES

BACKGROUND OF THE INVENTION

1. Field of the Invention

The present invention relates generally to the design and fabrication of packages for semiconductor devices. More particularly, it relates to a plastic semiconductor device package having an internal ground plane which provides for interlead isolation in order to reduce high frequency signal degradation within the package.

Individual semiconductor devices are usually packaged in either multilayer ceramic structures or placed on metal lead frames and encapsulated in plastic. Plastic packages are advantageous because of their low production costs and simplicity of manufacture. Ceramic packages, although substantially more expensive, are usually chosen in critical applications such as high temperature, high humidity, or the like. Of particular interest to the present invention, ceramic packages have generally been employed for high requency devices having operating frequencies in the megaHertz range and higher. In such high frequency applications, plastic packages have generally suffered from unacceptably high signal degradation.

Signal degradation can rise from a variety of factors, including variations in signal line impedance, capacitive and inductive coupling between adjacent signal lines, and the like. Impedance variations cause signal reflections and arise, in part, from lack of a suitable ground plane in most plastic semiconductor packages. Because of the methods of manufacture, i.e., mounting the semiconductor device on a lead frame and encapsulating the lead frame in the plastic material, it has been difficult to provide a second conductive layer within the package to act as a ground plane.

It would therefore be desirable to provide plastic semiconductor device packages having high frequency signal degradation characteristics approaching those of ceramic packages. In particular, it would be desirable to provide such plastic packages having an internal ground plane capable of minimizing variations in signal line resistance and capacitive loading between adjacent signal lines.

2. Description of the Background Art

U.S. Pat. No. 4,551,746 to Gilbert et al. discloses a ceramic semiconductor package having a metallized die attach pad connected to a metallization area by a via and a metallized castellation. U.S. Pat. No. 4,252,864 to Coldren describes a lead frame having leads which are intended to be folded over onto a device mounted on the frame. Schaper, (1981) *Proc. First Annual Conference of the International Packaging Society* Cleveland, Ohio, Nov. 9–10, pp. 38–42, describes inductance problems which can arise in packaging high frequency semiconductor devices; see, in particular, Section VIII. Copending application Ser. No. 557,119, assigned to the assignee of the present application, describes a low inductive impedance package having a semiconductor device mounted on a ground plane separate from a lead frame. The ground plane is connected to the device ground.

SUMMARY OF THE INVENTION

The present invention provides an improved plastic package particularly suitable for semiconductor devices capable of operating at high frequencies, typically 50 MHz and above. The invention relies on a modified lead frame which includes a plurality of individual frames, each frame having an integral ground plate which can be folded during the packaging operation to lie beneath a device paddle. The ground plates are connected to the device ground and define a highly uniform ground plane which minimizes signal line impedance variations and capacitive and inductive coupling.

In the preferred embodiment, the ground plane plate includes a plurality of bumps arranged to project between adjacent signal leads on the lead frame when the ground plate is folded under the device paddle. The package is completed by mounting the semiconductor device on the paddle, connecting the signal and power terminals on the device to the appropriate leads on the frame, and encapsulating the device in plastic, typically by transfer or injection molding.

The structure of the present invention has a number of advantages. First, the inclusion of the ground plane plate as a part of the lead frame allows convenient and low cost package assembly. The frame itself (prior to folding) is planar and can be formed by conventional stamping methods, minimizing the cost. Second, the ground plane reduces both capacitive and inductive coupling between adjacent leads and lessens impedance variations in individual leads to inhibit signal noise and cross-talk between adjacent leads. The location of bumps on the ground plane plate between adjacent leads further reduces both inductive and capacitive coupling by improving the proximity of the ground shield to the signal leads as well as providing better access for bonding the ground plane to the ground on the device.

BRIEF DESCRIPTION OF THE DRAWINGS

FIG. 1 is an isometric view of a portion of a lead frame constructed in accordance with the principles of the present invention.

FIG. 2 is a detail view illustrating a ground plane plate prior to folding while it is still connected to the lead frame.

FIG. 3 is an isometric view illustrating the device paddle, ground plane plate, and signal leads of a lead frame after folding.

FIG. 3 is an enlarged detail view showing a portion of FIG. 3.

FIG. 4 is a sectional view taken along line 4—4 of FIG. 3, shown without the semiconductor device mounted on the device paddle.

FIG. 5 is a sectional view similar to FIG. 4, shown with the semiconductor device mounted on the lead frame paddle, and the device encapsulated in plastic.

FIG. 6 is a sectional view similar to FIG. 5, shown with the connecting tabs trimmed after folding.

DESCRIPTION OF THE PREFERRED EMBODIMENTS

Referring to FIGS. 1 and 2, a lead frame 10 constructed in accordance with the principles of the present invention includes a first axial section 12 and a second axial section 14 defined by a central axial bar 16 and two side bars 18 and 20. The first axial section 12 includes a plurality of individual lead frames 22, there usually being from about 12 to 24 individual frames 22 in a single lead frame strip 10.

The individual lead frames 22 are generally conventional in construction and include a device paddle 26, a pair of paddle supports 28a and 28b, and a plurality of lead fingers 30. The paddle 26 and paddle supports 28 are connected between the central axial bar 16 and side bar 18, while the lead fingers 30 are supported by a tie bar 32 and transverse frame bars 34. For reasons described more fully hereinbelow, paddle support 28b includes a lock slot 36.

The second axial section 14 includes a plurality of ground plane plates 40 suspended on tabs 42a and 42b between the central axial bar 16 and side bar 20. Tab 42b terminates in a lock pin 43 which mates with lock slot 36 in paddle support 28b, as will be described in more detail hereinafter. The ground plane plates 40 are aligned with the individual lead frames 22 so that the connecting tab 42a of the plate is aligned with the paddle support 28a of the frame. Notches 44 are formed in the central axial bar 16 adjacent the connection to connecting tab 42a, as best observed in FIG. 2. The notches facilitate severing the paddle support 28a and connecting tab 42a from the bar 16 while leaving the tab and paddle support connected to each other.

The ground plane plate 40 is generally rectangular having dimensions which exceed those of the paddle 26 of the lead frame 22. Usually, the length and width of the ground plane plate 40 will approximate the length and width of the final encapsulated package (as illustrated in FIG. 5). The ground plane plate 40 includes ground connection tabs 46 located generally at each corner of its rectangular surface. The connection tabs 46 will extend outside of the final encapsulated package and will be used to connect the ground plane to ground on the mounting substrate, typically a printed circuit board.

Ground plane plate 40 also includes a plurality of bumps 50 formed in the surface. As illustrated in FIGS. 1-2, the bumps 50 would extend downward away from the viewer so that, when the plate 40 is folded under the device paddle 26, the bumps 50 will project upward between adjacent lead fingers 30, as illustrated in FIG. 3. Conveniently, the bumps 50 will be formed by impressing the ground plane plate 40, but may also be formed by an additive process. Plate 40 also includes a plurality of holes 52 which allow the encapsulating material to penetrate the ground plane during transfer or injection molding.

The lead frame 10 will be formed from conventional materials, typically copper, a copper alloy, Kovar®, or Alloy 42, by conventional pressing and stamping techniques, or by etching. The dimensions of the frame, number of lead fingers 30, and the like, are not critical. As illustrated, the lead frame is intended for a dual in-line package, but lead frames suitable for other packages, such as leaded quad packages, would also find use.

Referring now to FIGS. 1-3, the plastic semiconductor package of the present invention is assembled by first folding the ground plane plate 40 downward beneath the paddle 26 of the lead frame 22. Usually, the paddle will be folded without severing the connection of tab 42a to central axial bar 16 so that the lead frame strip 10 remains essentially intact. To facilitate folding and accurately control the distance between the paddle 26 and plate 40, the lock pin 43 of connecting tab 42b is folded upward and inserted into lock slot 36 on paddle support 28b. Such folding results in the structure illustrated in FIG. 3, where the ground plate 40 is attached to the lead frame 22 by the folded connecting tab 42a.

At the same time the ground plane 40 is folded, the ground connection tabs 46 may be folded in a stepped configuration, as illustrated in FIG. 3. Alternatively, ground connection tabs 46 may be folded after molding is completed in order to simplify the molding operation. Optionally, the paddle support 26 may be depressed downward, as illustrated in FIG. 4.

After folding the ground plane plate 40, a semiconductor die 60 is attached to the paddle 26 by conventional techniques, such as using a glass frit, a thermally-conducting epoxy, or a gold-silicon eutectic alloy. After die attach, the bonding pads 62 on the die 60 are connected to the lead fingers 30 by conventional techniques, such as wire bonding or tape-automated bonding. See, FIG. 3A, where exemplary wire bonds 63 are illustrated. Similarly, a ground ring 64 on the die 60 is connected to the bumps 50, either by wire bonding or tape-automated bonding (wire bonds 66 being illustrated). In the preferred arrangement illustrated, the bumps 50 lie between adjacent lead fingers 30 of the lead frame 22 so that the ground continuity continues between the lead fingers. By connecting the bumps 50 to the ground ring 64, the ground is further continued between the adjacent signal bonding connections, e.g., the wire bonds or tape-automated bonds. In a further preferred embodiment, the ground ring 64 includes spikes 65 which project inward between adjacent bonding pads 62. By connecting the bumps 50 directly to these spikes 65, continuity of the ground is enhanced and inductive and capacitive coupling between signal leads is reduced. Such construction promises enhanced isolation of the entire length of the signal connections and reduced noise in the package.

After the bonding of the semiconductor die 60 to the lead frame 22 and ground plane 40 is complete, the package may be completed by encapsulation using a conventional solid matrix encapsulant 70 (FIG. 5). Conventional transfer or injection molding techniques are used to dispense the encapsulant around the lead frame 22 until the bonding wires 63 and 66, semiconductor die 60, and lead frame are fully covered and protected from the environment. The encapsulant is then cured, typically at an elevated temperature and controlled humidity, followed by the final trim and forming into a desired shape, as illustrated in FIG. 5. After molding, the connection tabs 42a and 42b may be trimmed from the package to complete the assembly process, as illustrated in FIG. 6.

Although the foregoing invention has been described in some detail by way of illustration and example for purposes of clarity of understanding, it will be obvious that certain changes and modifications may be practiced within the scope of the appended claims.

What is claimed is:

1. An elongatae lead frame comprising:
    a plurality of individual frames arranged in a row, each of said frames having attached thereto a paddle, at least one paddle support, and a multiplicity of lead fingers having distal ends arranged in a pattern which circumscribes said paddle;
    a plurality of ground plane members, wherein each ground plane includes a plurality of bumps arranged in a pattern corresponding to the pattern of the distal ends of the lead fingers; and
    means for foldably attaching one ground plane member to each individual frame.

2. A lead frame as in claim 1, wherein the bumps are impressed into the ground plane.

3. An elongate lead frame comprising:

a first axial section including a plurality of individual frames, each frame having attached thereto a paddle, a pair of paddle supports, and a multiplicity of lead fingers having distal ends arranged in a pattern which circumscribes the paddle; and a second axial section having a plurality of ground plane members foldably attached thereto, said ground plane members being arranged so that one ground plane member lies adjacent each individual frame and wherein the ground plane includes a plurality of bumps arranged in a pattern corresponding to the pattern of ther distal ends of the lead fingers.

4. A lead frame as in claim 3, wherein the bumps are impressed into the ground plane.

5. A lead frame as in claim 4, wherein the two sections are separated by an axial bar.

6. A lead frame as in claim 5, wherein the second section further includes a side bar disposed parallel to the axiala bar, and wherein the ground planes are suspended between the axial bar and the side bar by a pair of tabs.

7. A lead frame as in claim 3, wherein the ground plane includes a lock pin and one of the paddle support includes a slot.

8. A semiconductor package comprising:
a paddle having two or more supports;
a semiconductor die mounted on the paddle;
a plurality of lead fingers having distal ends which circumscribed the paddle support;
a ground plane parallel to and spaced-apart from the paddle support, said ground plane having a plurality of bumps on its surface, wherein said bumps are arranged to project between adjacent lead fingers; and a solid plastic matrix encapsulating the paddle support, semiconductor die, ground plane and a portion of each lead.

9. A semiconductor package as in claim 8, wherein the ground plane is electrically connected to the paddle.

10. A semiconductor package as in claim 8, wherein the ground plane is electrically isolated from the paddle.

11. A semiconductor package as in claim 9, wherein the ground plane and the paddle are attached by a lock pin.

12. A semiconductor package as in claim 8, wherein the semiconductor die includes a ground connection and the ground plane is electrically connected to said ground connection.

13. A semiconductor package as in claim 12, wherein the ground connection on the die is a ring formed about the periphery of the die, and wherein the ground ring is connected to the ground plane by a plurality of bond members.

14. A semiconductor package as in claim 13 wherein the connections from the ground ring are made to the bumps on the ground plane and interdigitate between successive signal connections.

* * * * *